(12) United States Patent
Seshita

(10) Patent No.: US 6,617,919 B2
(45) Date of Patent: Sep. 9, 2003

(54) RF AMPLIFIER

(75) Inventor: Toshiki Seshita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/056,078

(22) Filed: Jan. 28, 2002

(65) Prior Publication Data
US 2002/0101283 A1 Aug. 1, 2002

(30) Foreign Application Priority Data
Jan. 29, 2001 (JP) ........................................ 2001-020507

(51) Int. Cl.⁷ .............................. H03F 1/00; H03F 3/60
(52) U.S. Cl. ........................ 330/66; 330/286; 330/310
(58) Field of Search ................................ 330/66, 67, 68, 330/286, 310

(56) References Cited

U.S. PATENT DOCUMENTS

| 4,465,979 A | * | 8/1984 | Russo ........................... 330/66 |
| 5,990,736 A | * | 11/1999 | Nasuno et al. ................ 330/66 |
| 6,300,827 B1 | * | 10/2001 | King ............................ 330/292 |
| 6,329,879 B1 | * | 12/2001 | Maruyama et al. .......... 330/289 |

FOREIGN PATENT DOCUMENTS

| JP | 4-261205 | 9/1992 |
| JP | 10-173568 | 6/1998 |

* cited by examiner

*Primary Examiner*—Robert Pascal
*Assistant Examiner*—Khanh Van Nguyen
(74) *Attorney, Agent, or Firm*—Oblon, Spivak, McClelland, Maier & Neustadt, P.C.

(57) ABSTRACT

A node for commonly supplying a ground potential in an amplification circuit (MMIC11) is formed. The input and output system ground surfaces of a printed wiring board (PWB) on which the amplification circuit (MMIC11) is to be mounted are electrically separated from each other on the printed wiring board (PWB). Since no ground pattern is present on the amplification circuit (MMIC11), the ground node of the amplification circuit (MMIC11) serves as a means for supplying a true ground potential. While a compact package is realized by preventing an increase in number of leads, oscillation is prevented, so a high gain can be realized.

5 Claims, 15 Drawing Sheets

RF AMPLIFIER

BACKGROUND OF THE INVENTION

CROSS REFERENCE TO RELATED APPLICATION

This application claims benefit of priority under 35 USC 1119 to Japanese Patent Application No. 2001-20507, filed on Jan. 29, 2001, the entire content of which are incorporated by reference herein.

The present invention relates to an RF amplifier and, more particularly, to an amplifier with a plurality of amplification stages.

As an RF amplifier for amplifying an RF signal of 1 GHz or more, an amplifier used as the transmission terminal of, e.g., a personal handy phone system (to be referred to as a PHS hereinafter) and related to the present invention will be described.

Such an RF amplifier often uses a source-grounded amplifier formed of a GaAs MESFET (Metal Semiconductor Field Effect Transistor). In this case, a gain of about 10 dB can be realized per amplification stage, and an RF MMIC (Monolithic Microwave Integrated Circuit) formed of two to four amplification stages is widely used.

Generally, such an MMIC is encapsulated in a plastic package which is an inexpensive package. To realize an MMIC as compact as possible, a package with a minimum number of leads is employed.

FIG. 1 shows, as an example of the RF amplifier related to the present invention, an arrangement in which an amplification circuit MMIC with two amplification stages is packaged in a plastic package PKG with six pins LIN, LOUT, LVd1, LGND1, LGND2_1, and LGND2_2.

The amplification circuit MMIC is mounted on a bed BD, and respective pads PIN, POUT, PVd1, PGND1, and PGND2 of the amplification circuit MMIC and the corresponding terminals LIN, LOUT, LVd1, LGND1, and LGND2_1 and LGND2_2 are connected to each other through bonding with wires W.

FIG. 2 shows a state wherein the amplification circuit MMIC encapsulated in the plastic package PKG is mounted on a printed wiring board PWB serving as a mother board. Patterned signal lines SIN and SOUT, power supply line SVd1, and ground surfaces SGND1 and SGND2 are formed on the printed wiring board PWB, and are connected to the corresponding terminals LIN, LOUT, LVd1, LGND1, and LGND2_1 and LGND2_2 with solder.

The lower surface of the printed wiring board PWB has a ground surface (not shown). The ground surfaces SGND1 and SGND2 formed on the upper surface of the printed wiring board PWB extend through via holes VH1, and via holes VH1 and VH2, respectively, to be connected to the ground surface on the lower surface of the printed wiring board PWB.

FIG. 3 is an equivalent circuit diagram showing the configuration of the amplification circuit formed on the printed wiring board PWB.

GaAs MESFETs Q1 and Q2 form two source-grounded amplification stages. The drain of the MESFET Q1 is connected to the power supply line SVd1, serving as a power supply system transmission line, through the pad PVd1 and a parasitic inductance Lw_vd1 parasitic on a lead and bonding wire. The gate of the MESFET Q1 is connected to the signal line SIN through the pad PIN and a parasitic inductance Lw_in, and its source is grounded through the pad PGND1 and a parasitic inductance Lw_gnd1.

The drain of the MESFET Q2 is connected to the signal line SOUT, serving as an output system transmission line, through the pad POUT and an inductance Lw_out, its gate is connected to the drain of the MESFET Q1 through a capacitor Cs, and its source is grounded through the pad PGND2 and an inductance Lw_gnd2.

A ballast resistor Rst1 is connected between the gate and source of the MESFET Q1, and a ballast resistor Rst2 is connected between the gate and source of the MESFET Q2.

The inductance Lw_vd1, power supply line SVd1, and interstage capacitor Cs form an interstage matching circuit. The respective parasitic inductances are accounted for by the sum of the inductances of the bonding wires and leads connected to the pads of the amplification circuit MMIC, the ground surface on the printed wiring board PWB, and the via holes VH, as described above.

With this configuration, the ground surface formed on the lower surface of the printed wiring board PWB serves as a ground node for supplying a true ground potential. Accordingly, the ground pads PGND1 and PGND2 of the amplification circuit MMIC electrically float from their true ground surfaces through the parasitic inductances Lw_gnd1 and Lw_gnd2.

Therefore, the ground surfaces, to which the ground pad PGND1 of the MESFET Q1 of the first amplification stage and the ground pad PGND2 of the MESFET Q2 of the second amplification stage are respectively connected on the printed wiring board PWB, are separated from each other. This is because if the first and second amplification stages of the amplification circuit MMIC share the same ground surface, a positive feedback path may be formed to extend from the source of the MESFET Q2 of the second stage to the source of the MESFET Q1 of the first stage, to undesirably cause the amplifier to oscillate.

On the other hand, if the parasitic inductance present between the true ground surface and the pads PGND1 and PGND2 is large, the gain of the amplifier decreases. To suppress such a decrease in gain, the numbers of wires and leads assigned to the node for supplying the ground potential in the amplification circuit MMIC may be increased. When the number of leads is increased, however, the package cost increases.

In this manner, with the amplifier described above, when a high gain is to be obtained, the number of leads increases and the package cost increases.

SUMMARY OF THE INVENTION

According to one aspect of the present invention, there is provided an RF amplifier in which an amplification circuit with at least two amplification stages is mounted on a printed wiring board, comprising a ground node formed in the amplification circuit to commonly supply a ground potential to all the amplification stages, a first ground surface formed on the printed wiring board to supply a ground potential on an input system transmission line that transmits an input signal to be supplied to the amplification circuit, and a second ground surface, which is formed on the printed wiring board to supply a ground potential on an output system transmission line that transmits an output signal output from the amplification circuit, is electrically separated from the first ground surface on the printed wiring board, and is connected to the first ground surface through the ground node in the amplification circuit.

BRIEF DESCRIPTION OF THE DRAWINGS

In the accompanying drawings.

DESCRIPTION OF THE PREFERRED EMBODIMENTS

The embodiments of the present invention will be described with reference to the accompanying drawings.

(1) First Embodiment

Figure 4:
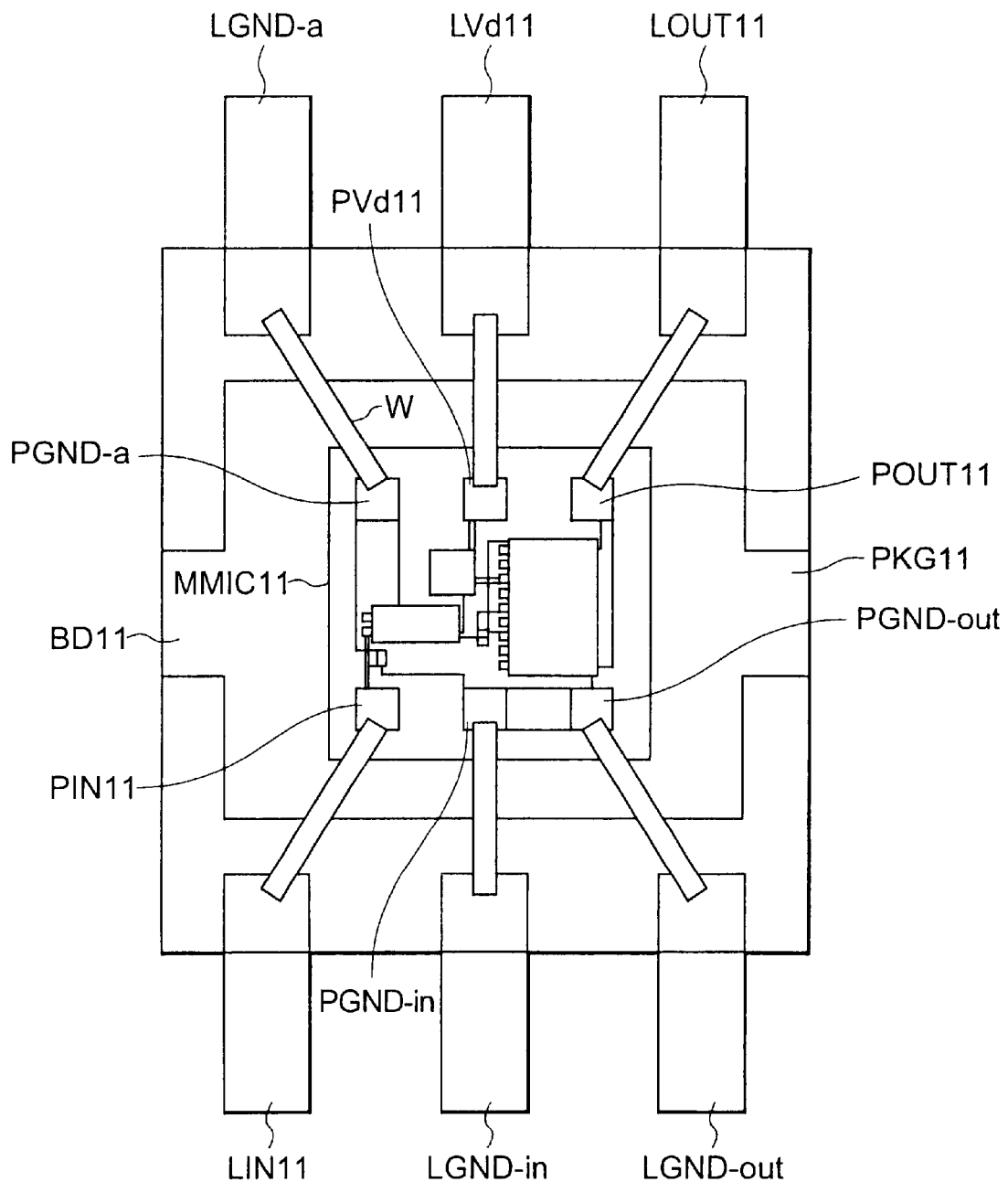
FIG. 4 is a plan view showing the schematic arrangement of the interior of the package of an RF amplifier according to the first embodiment of the present invention.

An RF amplifier according to the first embodiment of the present invention will be described. FIG. 4 shows the schematic configuration of the interior of the package of the amplifier according to this embodiment.

An amplification circuit MMIC11 is mounted on a bed BD11. An input pad PIN11 of the amplification circuit MMIC11 is wire-bonded to a lead LIN11 through a wire W. Similarly, a first ground pad PGND_in, second ground pad PGND_out, third ground pad PGND_a, first power supply pad PVd11, and output pad POUT11 of the amplification circuit MMIC11 are wire-bonded to leads LGND_in, LGND_out, LGND_a, LVd11, and LOUT11, respectively.

The first ground lead LGND_in and input signal lead LIN11 are adjacent, and the second ground lead LGND_out and output signal lead LOUT11 oppose each other, as shown in FIG. 4, or adjacent to each other.

The first, second, and third ground pads PGND_in, PGND_out, and PGND_a of the amplification circuit MMIC11 of this embodiment are connected to the corresponding first, second, and third ground leads LGND_in, LGND_out, and LGND_a, respectively.

Figure 5:
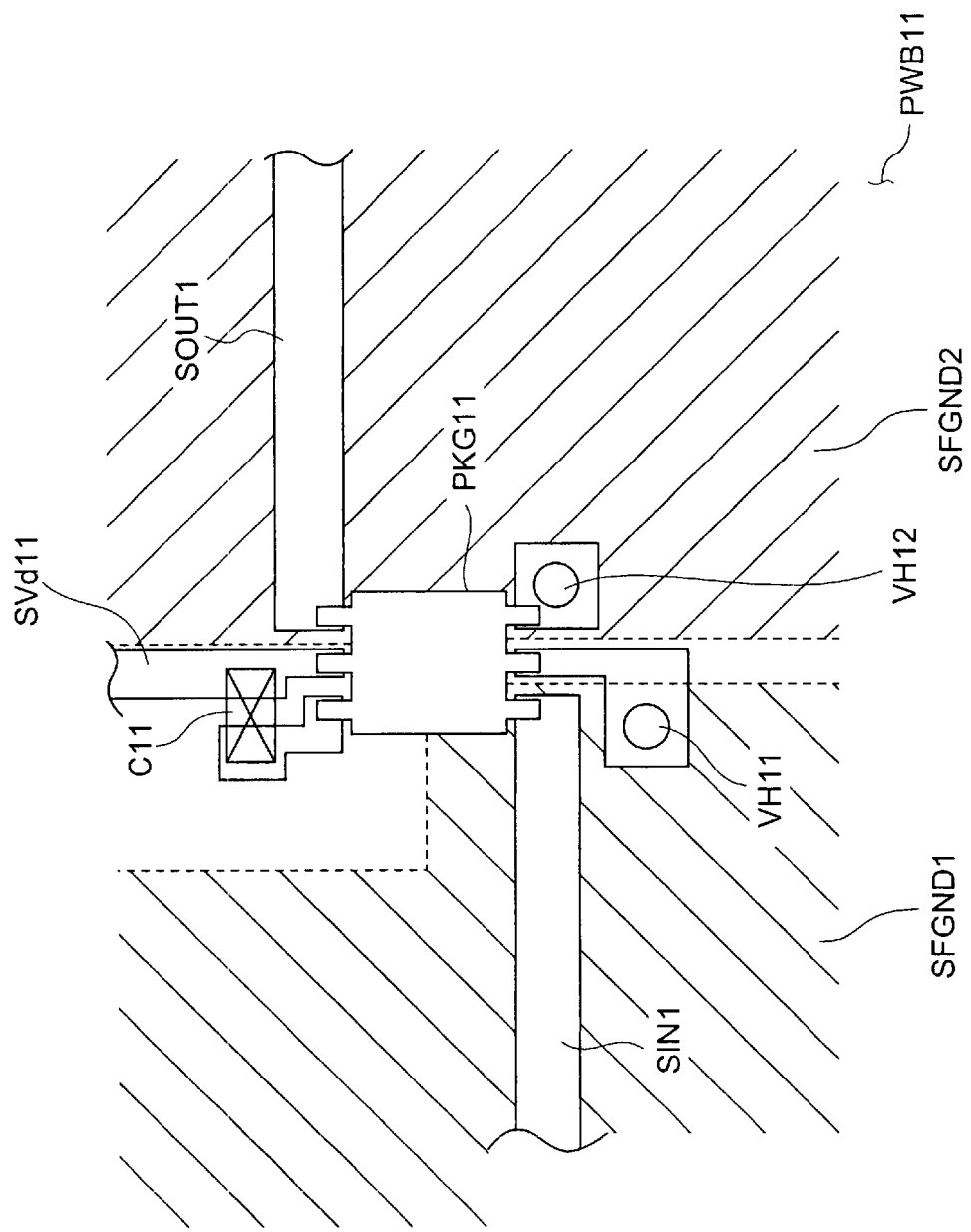
FIG. 5 is a plan view showing a schematic configuration obtained when this RF amplifier is mounted on a printed wiring board.

FIG. 5 shows a state in which the amplification circuit MMIC11 encapsulated in a package PKG11 is mounted on, e.g., a printed wiring board PWB11 serving as a mother board. The printed wiring board PWB11 has the following features in configuration.

First, a ground surface SFGND1 (a hatched region SFGND1 in FIG. 5 and present under a signal line SIN1) included, together with the signal line SIN1, in a microstrip line MSL_in serving as an input system transmission line for transmitting an input signal IN, and a ground surface SFGND2 (a hatched region SFGND2 in FIG. 5 and present under a signal line SOUT1) included, together with the signal line SOUT1, in a microstrip line MSL_out serving as an output system transmission line for transmitting an output signal OUT are electrically separated on the printed wiring board PWB11. The ground surfaces SFGND1 and SFGND2 are connected to each other through terminals PGN_in and PGN_out of the amplification circuit MMIC11.

Second, the ground terminal of a decoupling capacitor C11 connected to a third power supply line SVd11 is connected to the third ground lead LGND_a of the amplification circuit MMIC11, and no ground surface is formed under its pattern and the capacitor C11.

Figure 6:
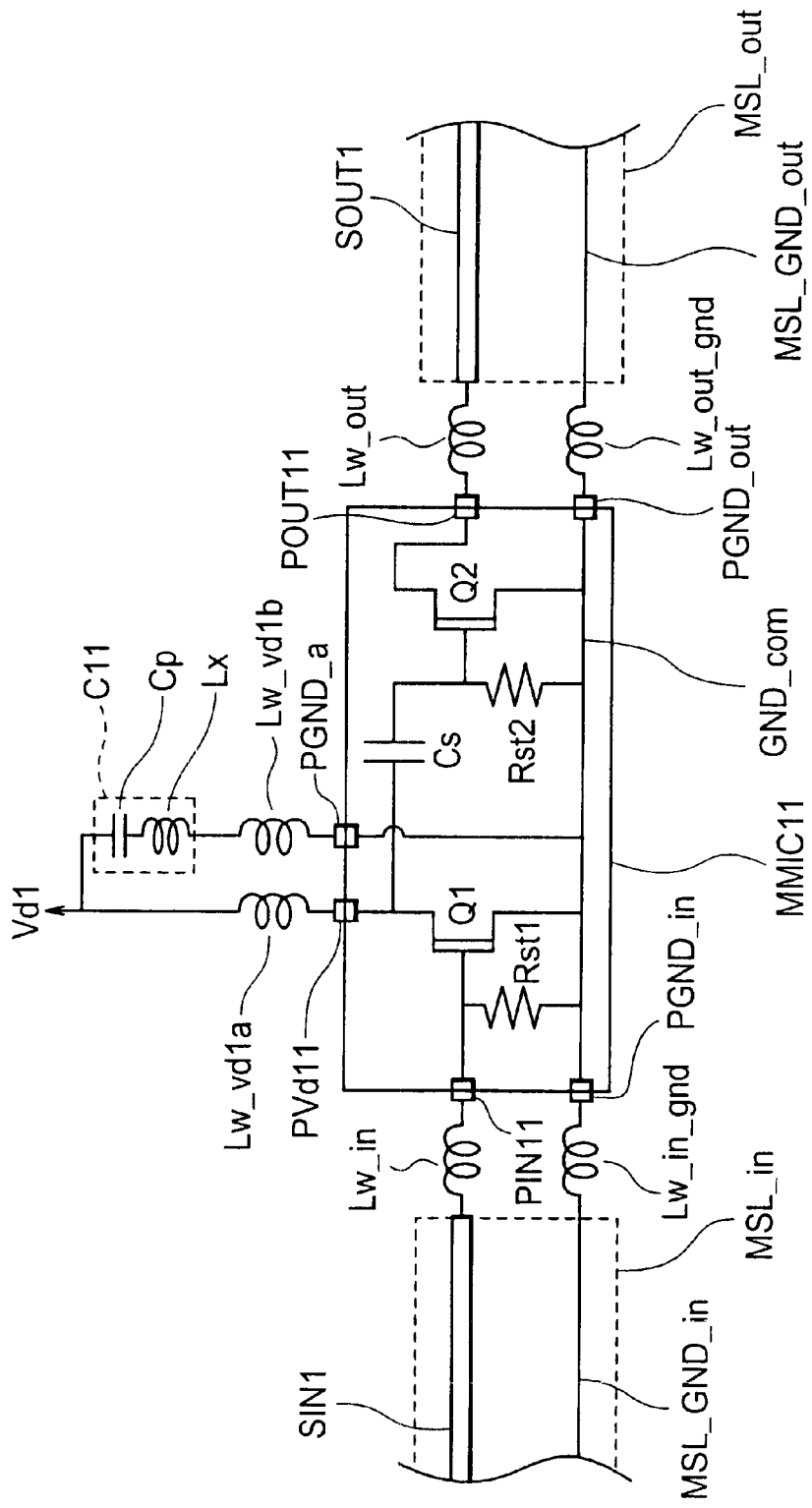
FIG. 6 is a circuit diagram showing the configuration of the equivalent circuit of this RF amplifier.

FIG. 6 shows the configuration of the equivalent circuit of the amplification circuit MMIC11 mounted on the printed wiring board PWB11. MESFETs Q1 and Q2 form two source-grounded amplification stages. The drain, gate, and source of the MESFET Q1 are connected to the power supply pad PVd11, input pad PIN11, and ground pad PGND_in, respectively.

The drain, gate, and source of the MESFET Q2 are connected to the output pad POUT11, the drain of the MESFET Q1 through the interstage capacitor Cs, and the ground pad PGND_out, respectively.

The third ground pad PGND_a is connected to the first and second ground pads PGND_in and PGND_out. The first, second, and third ground pads PGND_in, PGND_out, and PGND_a are connected in common, and serve as a ground node in the amplification circuit MMIC11 for commonly supplying the ground potential.

The interstage capacitor Cs makes up an interstage matching circuit together with an external passive element connected to the power supply pad PVd11.

The decoupling capacitor C11 has a capacitance Cp and parasitic inductance Lx.

Parasitic inductances Lw_vd1$a$ and Lw_vd1$b$ shown in FIG. 6 are inductances parasitic on wires and leads connected to the power supply pad PVd11 and ground pad PGND_a, respectively.

Parasitic inductances Lw_in and Lw_out are inductances parasitic on wires and leads connected to an input pad PIN and output pad POUT, respectively.

Parasitic inductances Lw_in_gnd and Lw_out_gnd are respectively the sums of the inductances of wires and leads connected to the ground pads PGND_in and PGND_out, the ground patterns on the printed wiring board PWB11, and via holes VH11 and VH12.

The microstrip line MSL_in serving as the input system transmission line has the signal line SIN1 for transmitting an input signal, and a ground surface MSL_GND_in. Similarly, the microstrip line MSL_out serving as the output input system transmission line has the signal line SOUT1 for transmitting an input signal, and a ground surface MSL_GND_out.

As described above, concerning the configuration of the amplification circuit MMIC11 formed of two stages or more of source-grounded FETs and the configuration of the ground pattern of the printed wiring board PWB11 on which the amplification circuit MMIC11 is mounted, the first embodiment has the following features.

First, all the ground potentials in the amplification circuit MMIC11, or the source potentials of the source-grounded MESFETs Q1 and Q2 in this case, are connected to the common ground node in the amplification circuit MMIC11.

Second, on the printed wiring board PWB11, the ground line MSL_GND_in of the input system transmission line (microstrip line) MSL_in for transmitting the input signal to the amplification circuit MMIC11 is connected to the ground terminal PGND_in of the amplification circuit MMIC11. The ground terminal PGND_in is formed adjacent to the input terminal PIN11.

Third, on the printed wiring board PWB11, the ground line MSL_GND_out of the output system transmission line (microstrip line) MSL_out for transmitting the output signal from the amplification circuit MMIC11 is connected to the ground terminal PGND_out of the amplification circuit MMIC11. The ground terminal PGND_out is formed adjacent to or to oppose the output terminal PIN11.

Fourth, on the printed wiring board PWB11, the ground surface for supplying the ground potential is electrically separated into the input ground surface SFGND1 and output ground surface SFGND2 with respect to the packaging area of the amplification circuit MMIC11 as the boundary. The ground surfaces SFGND1 and SGFND2 are not connected to each other on the printed wiring board PWB11, but are connected to each other through the ground terminals PGND_in and PGND_out of the amplification circuit MMIC11.

In order to stabilize the GND potential to be supplied to other elements to be mounted on the printed wiring board PWB11, even if the ground surfaces SFGND1 and SGFND2 are formed at a region electrically remote from the amplification circuit MMIC11 of the printed wiring board PWB11 and are connected to each other through a sufficiently high RF impedance, the effect of this embodiment does not suffer.

Fifth, the power supply terminals PVd11 of the source-grounded FETs, excluding at least the one on the final stage, of the amplification circuit MMIC11, are connected to the power supply line (the line indicated by an arrow vd1 in FIG. 6) of the printed wiring board PWB11. The ground terminal of the decoupling capacitor C11 connected to this power supply line is connected to the ground pad PGND_a of the amplification circuit MMIC11.

In this manner, this embodiment has several features in configuration. The configuration with which the ground potential is supplied on the RF signal transmission line is particularly important. In the amplifier shown in FIGS. 1 to 3, in the line extending in the amplification circuit MMIC through the signal line SIN, the true ground surface is the one formed on the printed wiring board PWB. Hence, the ground node in the amplification circuit MMIC electrically floats from the true ground surface of the printed wiring board PWB through an inductance. In other words, in the above amplifier, the ground surface in the amplification circuit MMIC is a pseudo-ground surface floating from the true ground surface. For this reason, the circuit may undesirably oscillate due to this pseudo-ground surface.

In contrast to this, according to this embodiment, while the RF signal is transmitted through the signal line SIN1 of the microstrip line MSL_in and is transmitted to the microstrip line MSL_out through the amplification circuit MMIC11, nothing is present, other than the ground node in the amplification circuit MMIC11, that serves as a node for supplying the ground potential. Therefore, according to this embodiment, the ground node in the amplification circuit MMIC11 serves as a means for supplying the true ground potential, so the possibility of oscillation can be avoided. Also, a decrease in gain caused by the inductances Lw_gnd1 and Lw_gnd2 parasitic between the ground pads PGND1 and PGND2 and the ground surface in FIG. 6, which shows the equivalent circuit of the above-described amplifier related to the present invention, is also prevented.

A simulation was performed concerning the above-described amplifier related to the present invention and the amplifier according to this embodiment. The result of the simulation will be described. The simulation was performed with the amplifier shown in FIGS. 1 and 3 and that shown in FIGS. 4 to 6 according to the first embodiment, both of which were designed under the same standard to serve as a PHS power amplifier with a carrier frequency of 1.9 GHz.

Figure 1:
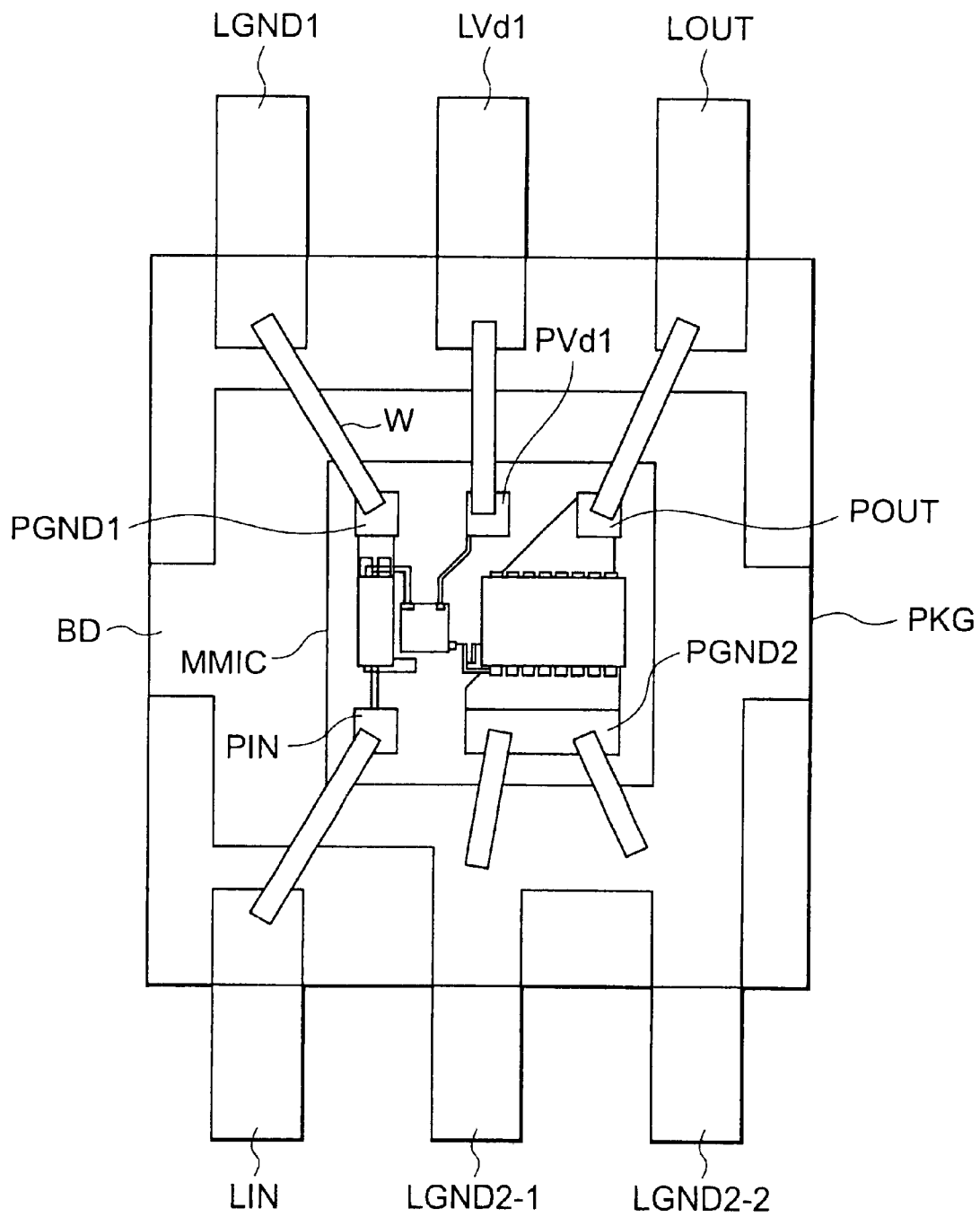
FIG. 1 is a plan view showing the schematic configuration of the interior of the package of an RF amplifier related to the present invention.
Figure 2:
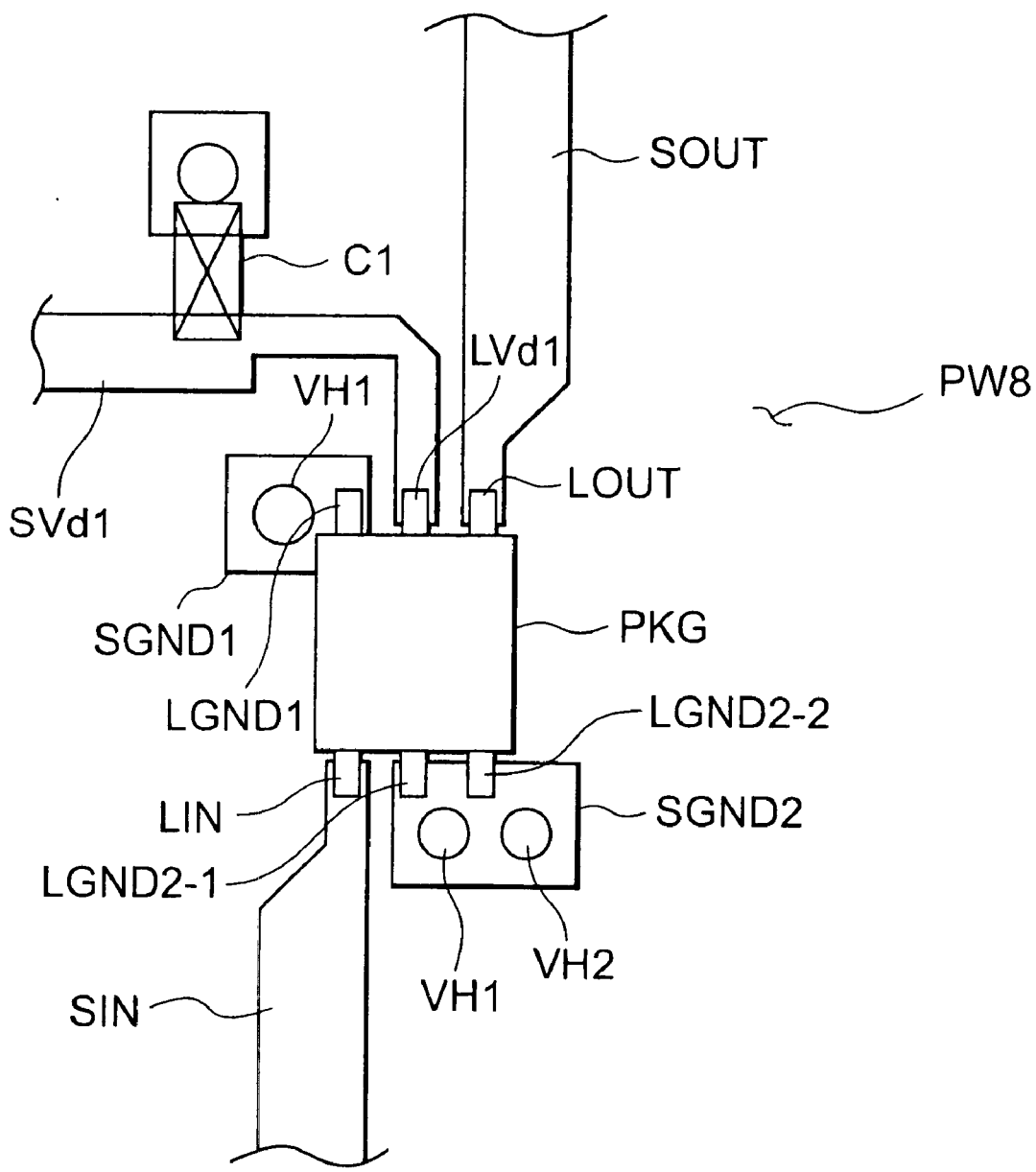
FIG. 2 is a plan view showing a schematic configuration obtained when this RF amplifier is mounted on a printed wiring board.
Figure 3:
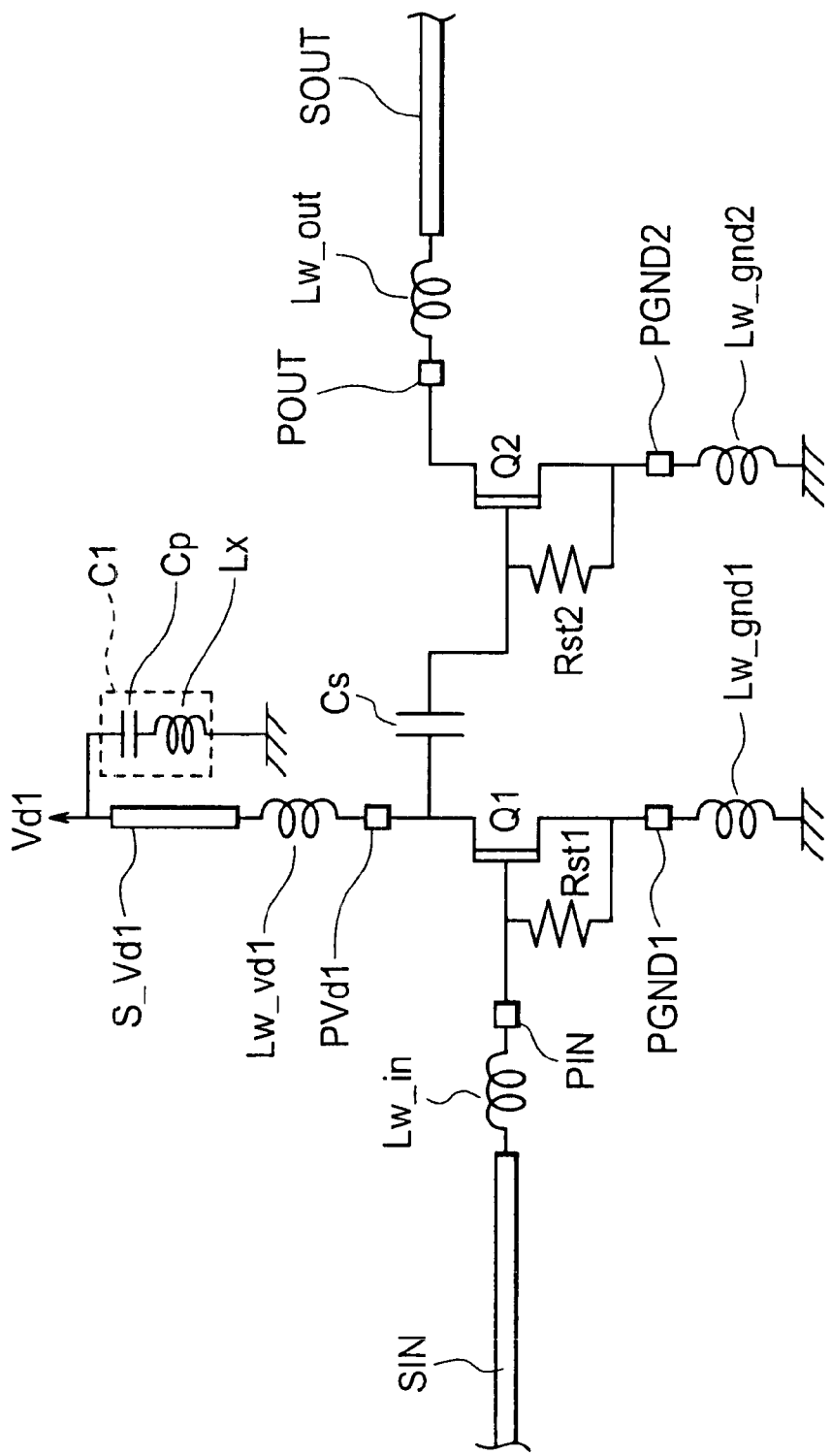
FIG. 3 is a circuit diagram showing the configuration of the equivalent circuit of this RF amplifier.

The amplifier shown in FIGS. 1 to 3 and that according to this embodiment had the same MESFET size, the same semiconductor chip area, and the same plastic package. The main circuit parameters common between the two amplifiers are as follows.

Gate width of the MESFET Q1: 0.6 mm
Gate width of the MESFET Q2: 3.6 mm
Inductance of one wire: 0.6 nH
Inductance of one lead: 0.4 nH
Semiconductor chip size: 750 $\mu$m×740 $\mu$m
Number of external terminals of plastic package: 6

The parameter of the decoupling capacitor C11 of the amplifier according to this embodiment is as follows.

Capacitance Cp: 5 pF, parasitic inductance Lx: 1 nH

Usually, as the capacitance Cp, a large capacitance of 100 pF or more is used. In this embodiment, however, a small capacitance of 5 pF was employed. This is due to the following reason. The sum of the parasitic inductances Lw_vd1$a$ and Lw_vd1$b$ respectively parasitic on the power supply pad PVd11 and third ground pad PGND_a and the inductance Lx parasitic on the decoupling capacitor C11 is 3 nH, which already exceeds a value necessary for interstage matching. If the capacitance Cp is set to a small value, a desired impedance can be obtained.

According to the result of the simulation, where a small signal gain of the amplifier shown in FIGS. 1 to 3 was 26.3 dB, that of the amplifier of this embodiment was 33.8 dB. Namely, in this embodiment, the gain is higher than that of the amplifier shown in FIGS. 1 to 3 by 7.5 dB.

The gain and stability usually trade off each other. In this embodiment, however, the values of the ballast resistors Rst1 and Rst2 are adjusted so the minimum value of the stability factor in the frequency range of 0 GHz to 7 GHz becomes 1.3. Thus, the gain can be increased without impairing the stability.

(2) Second Embodiment

The second embodiment of the present invention will be described.

Figure 7:
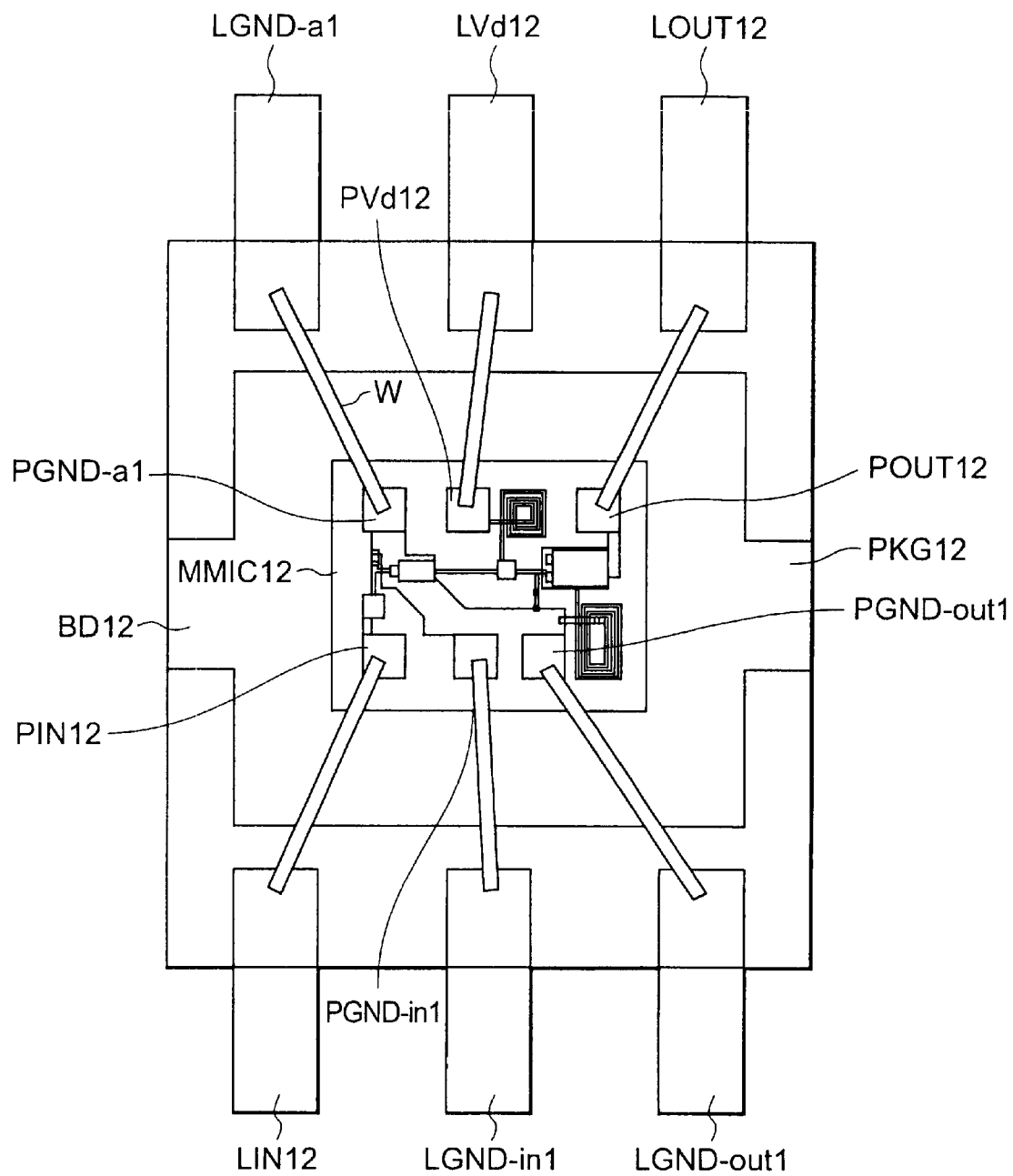
FIG. 7 is a plan view showing the schematic arrangement of the interior of the package of an RF amplifier according to the second embodiment of the present invention.

FIG. 7 shows the schematic configuration of the interior of the package of an RF amplifier according to this embodiment.

An amplification circuit MMIC12 is mounted on a bed BD12. An input pad PIN12, first ground pad PGND_in1, second ground pad PGND_out1, third ground pad PGND_a1, first power supply pad Pvd12, and output pad POUT12 of the amplification circuit MMIC11 are wire-bonded to leads LIN12, LGND_in1, LGND_out1, LGND_a1, LVd12, and LOUT12, respectively.

The first ground lead LGND_in1 and input signal lead LIN12 are adjacent, and the second ground lead LGND_out1 and output signal lead LOUT12 oppose each other, as shown in FIG. 7, or adjacent to each other.

The first, second, and third ground pads PGND_in1, PGND_out1, and PGND_a1 of the semiconductor chip MMIC12 of this embodiment are connected to the corresponding first, second, and third ground leads LGND_in1, LGND_out1, and LGND_a1, respectively, in the same manner as in the first embodiment.

The amplification circuit MMIC12 according to this embodiment is packaged on a printed wiring board PWB11 identical to that shown in FIG. 5 in the same manner as the amplification circuit MMIC11 of the first embodiment.

Figure 8:
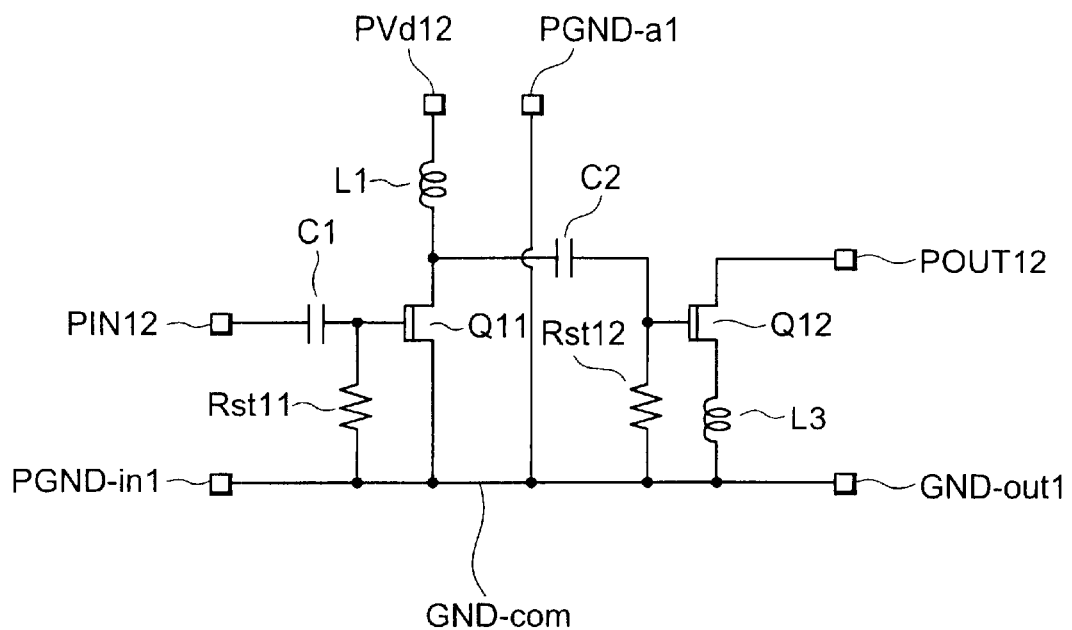
FIG. 8 is a circuit diagram showing the configuration of the equivalent circuit of this RF amplifier.

FIG. 8 shows the configuration of the equivalent circuit of the amplification circuit MMIC12 of this embodiment.

MESFETs Q11 and Q12 form two source-grounded amplification stages. The drain, gate, and source of the MESFET Q11 are connected to the input pad PVd12 through an inductance L1, the input pad PIN12, and the ground pad PGND_in1, respectively.

The drain, gate, and source of the MESFET Q12 are connected to the output pad POUT12, the drain of the MESFET Q11 through an interstage capacitor Cs, and the ground pad PGND_out1 through an inductance L3, respectively.

The third ground pad PGND_a1 is connected to the first and second ground pads PGND_in1 and PGND_out1. The first, second, and third ground pads PGND_in1, PGND_out1, and PGND_a1 form a ground node in the amplification circuit MMIC12 for commonly supplying the ground potential to the sources of the MESFETs Q11 and Q12.

The interstage capacitor Cs makes up an interstage matching circuit together with an external passive element connected to the inductance L1 and power supply pad PVd11.

Concerning the ground potential in the amplification circuit MMIC12, nothing is preset, other than the ground node in the amplification circuit MMIC12, that serves as a ground potential supply means, in the same manner as in the first embodiment. Therefore, according to the second embodiment, the ground node in the amplification circuit MMIC12 serves as a means for supplying the true ground potential, thereby preventing oscillation of the circuit.

The inductances Lw_gnd1 and Lw_gnd2 parasitic between the ground pads PGND1 and PGND2 and the ground surface, that are present in the amplifier shown in FIGS. 1 to 3, are not present. A decrease in gain caused by the inductances Lw_gnd1 and Lw_gnd2 can accordingly be prevented.

When the second embodiment is compared with the first embodiment, it is different from the first embodiment in that the source inductance L3 is connected between the source of the MESFET Q12 and the ground node. Distortion in the signal waveform tends to occur most likely in the last stage among the plurality of stages. Considering this fact, the inductance L3 is added to suppress distortion in the last stage even if the gain may be slightly decreased.

The main circuit parameters of this embodiment are as follows.

The threshold voltages of the MESFETs Q11 and Q12 are −0.3 V, the gate width of the MESFET Q11 is 160 μm, and the gate width of the MESFET Q12 is 500 μm.

Figure 9:
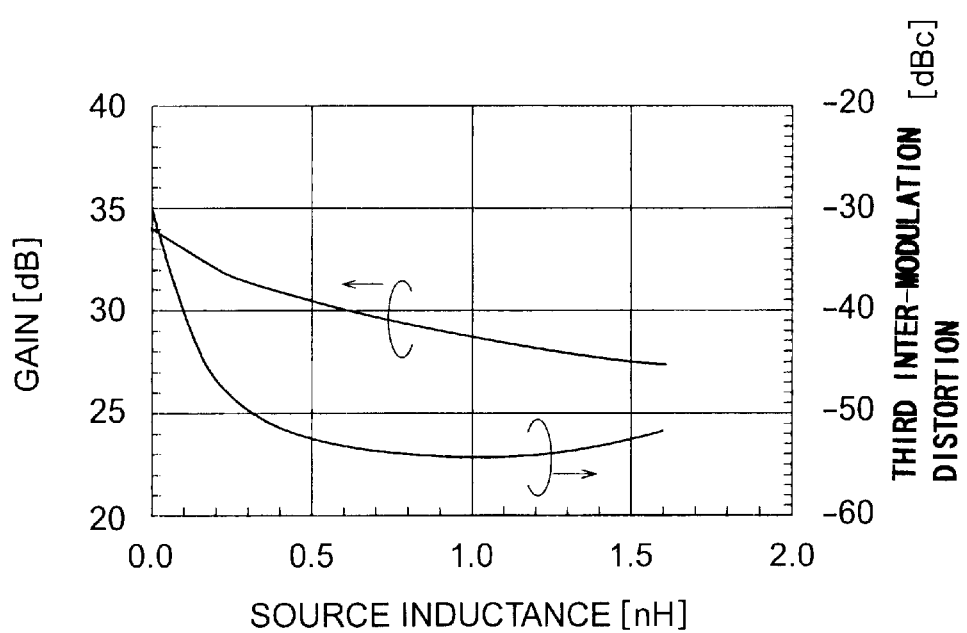
FIG. 9 is a graph showing the source inductance dependencies of the gain and the third inter-modulation distortion in this RF amplifier when the output power is constant.

FIG. 9 shows the dependences of the gain and a third inter-modulation distortion IM3 on the source inductance L3 when the output power is constant (8 dBm).

As the inductance L3 increases, the gain decreases monotonously. The third inter-modulation distortion IM3 takes a minimal value when the inductance L3 is 1 nH. When the inductance L3 is added, a kind of negative feedback path is formed. The distortion is probably improved as the effect of the negative feedback.

The negative feedback caused by the inductance L3 is not an ideal negative feedback in which part of the output signal is directly added to the input without changing its phase. In an ideal negative feedback circuit, the feedback coefficient is a real number. In a negative feedback circuit formed by a source inductance, the feedback coefficient is a complex number. Probably this is the reason why the third inter-modulation distortion IM3 does not decrease monotonously with respect to an increase in the inductance L3 but takes a minimum value when the inductance L3 is 1 nH.

In this embodiment, since the source inductance L3 is set to 1 nH, the third inter-modulation distortion IM3 can be improved by about 14 dB when compared to a case wherein no source inductance is present.

When the 1-nH source inductance L3 was added, the gain decreased by about 5 dB. Compared to the gain of 26.3 dB of the amplifier shown in FIGS. 1 to 3, the gain was improved to 28.7 dB.

The embodiments described above are merely examples, and do not limit the present invention. For example, in the equivalent circuit of the amplification circuit MMIC11 shown in FIG. 6, two stages of MESFETs, i.e., the MESFETs Q1 and Q2 are connected. Alternatively, n stages of MESFETs Q1 to Qn may be connected, as shown in FIG. 10.

Figure 11:
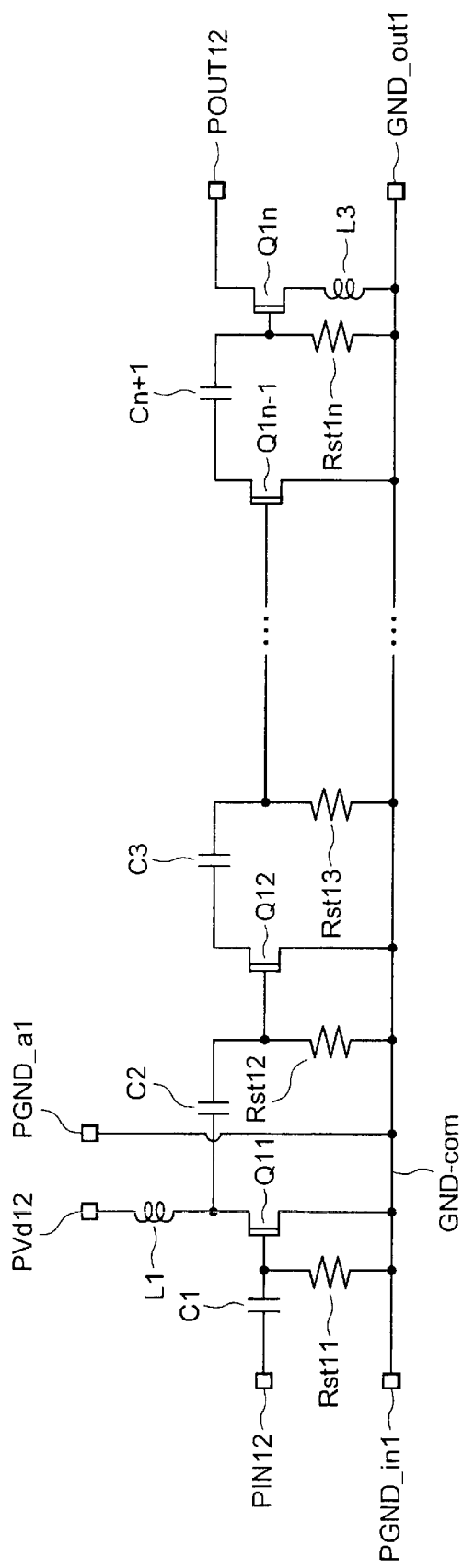
FIG. 11 is a circuit diagram showing a configuration obtained when the MESTET of FIG. 8 is connected in n stages.

Similarly, in the equivalent circuit of the amplification circuit MMIC12 shown in FIG. 8, two stages of MESFETs, i.e., the MESFETs Q11 and Q12 are connected. Alternatively, n stages of MESFETs Q11 to Q1n may be connected, as shown in FIG. 11.

In the above embodiment, a source-grounded circuit is formed by using the MESFETs formed on a GaAs substrate. However, the present invention is not limited to this, and a source-grounded circuit may be formed by using MOSFETs formed on a silicon substrate. Alternatively, the present invention can be similarly applied to a case wherein an emitter-grounded circuit is formed by using bipolar transistors.

Figure 10:
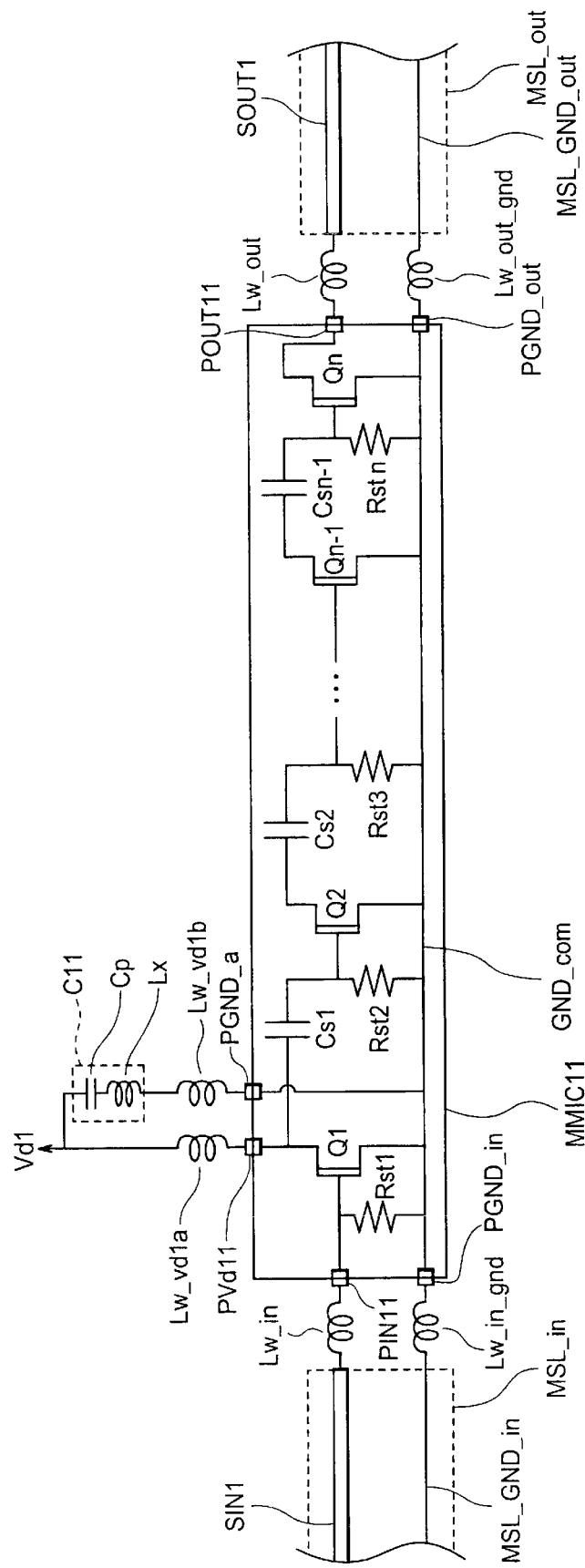
FIG. 10 is a circuit diagram showing a configuration obtained when the MESFET of FIG. 6 is connected in n stages.
Figure 12:
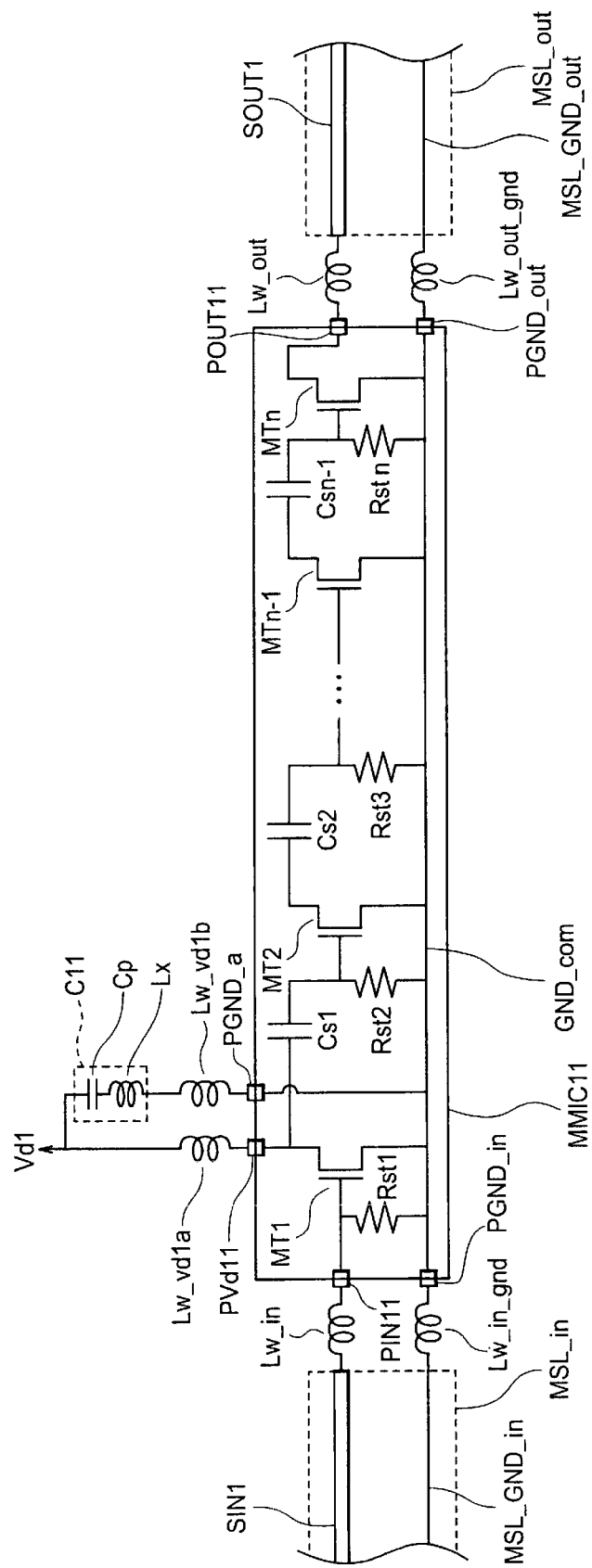
FIG. 12 is a circuit diagram showing a configuration obtained when the MESFETs in FIG. 10 are replaced with MOSFETS.
Figure 13:
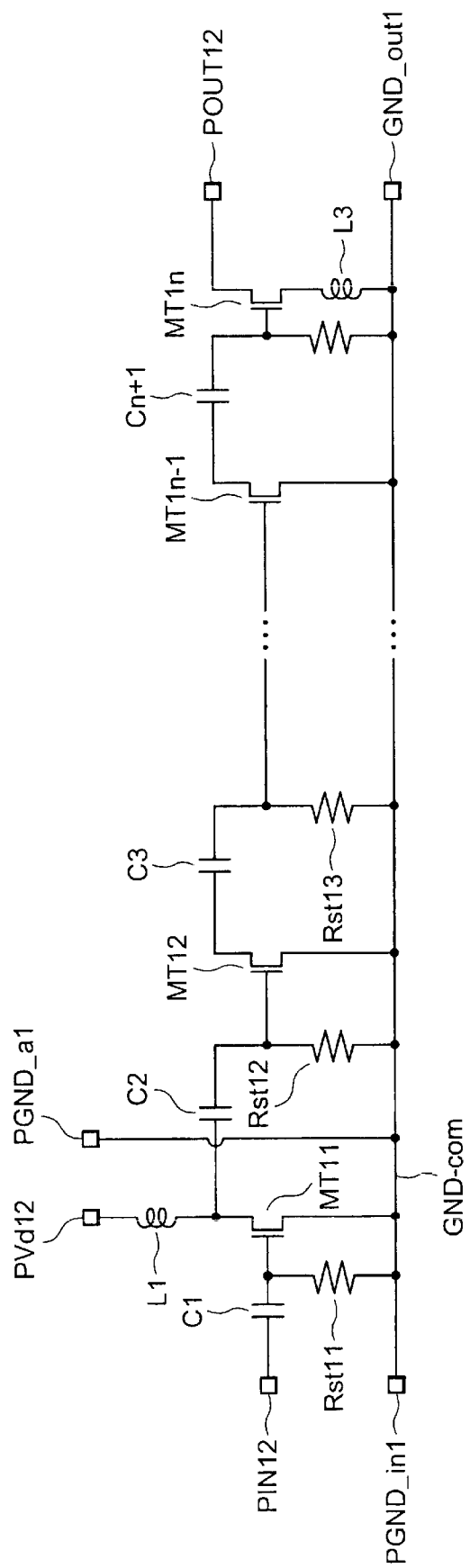
FIG. 13 is a circuit diagram showing a configuration obtained when the MESFETs in FIG. 11 are replaced with MOSFETs.

For example, the n stages of MESFETs Q1 to Qn shown in FIG. 10 may be replaced with n stages of MOSFETs MT1 to MTn, as shown in FIG. 12. The n stages of MESFETs Q11 to Q1n shown in FIG. 11 may be replaced with n stages of MOSFETs MT11 to MT1n, as shown in FIG. 13.

Figure 14:
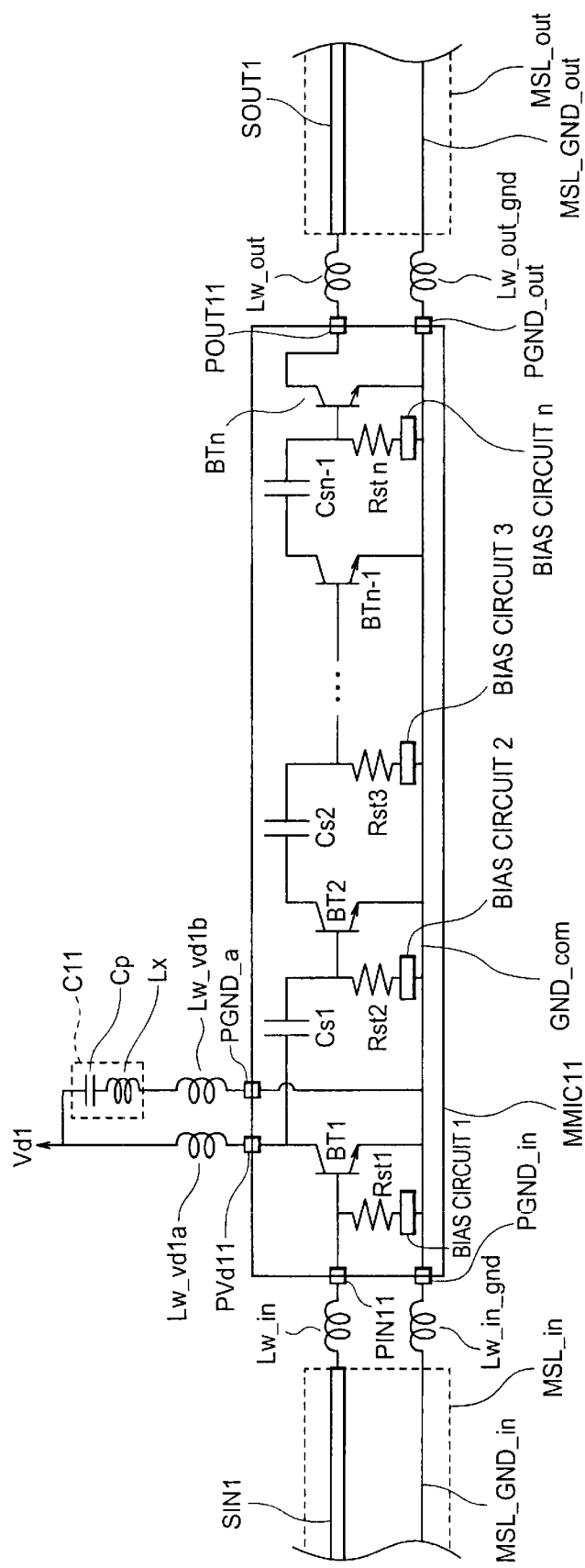
FIG. 14 is a circuit diagram showing a configuration obtained when the MESFETs in FIG. 10 are replaced with bipolar transistors.
Figure 15:
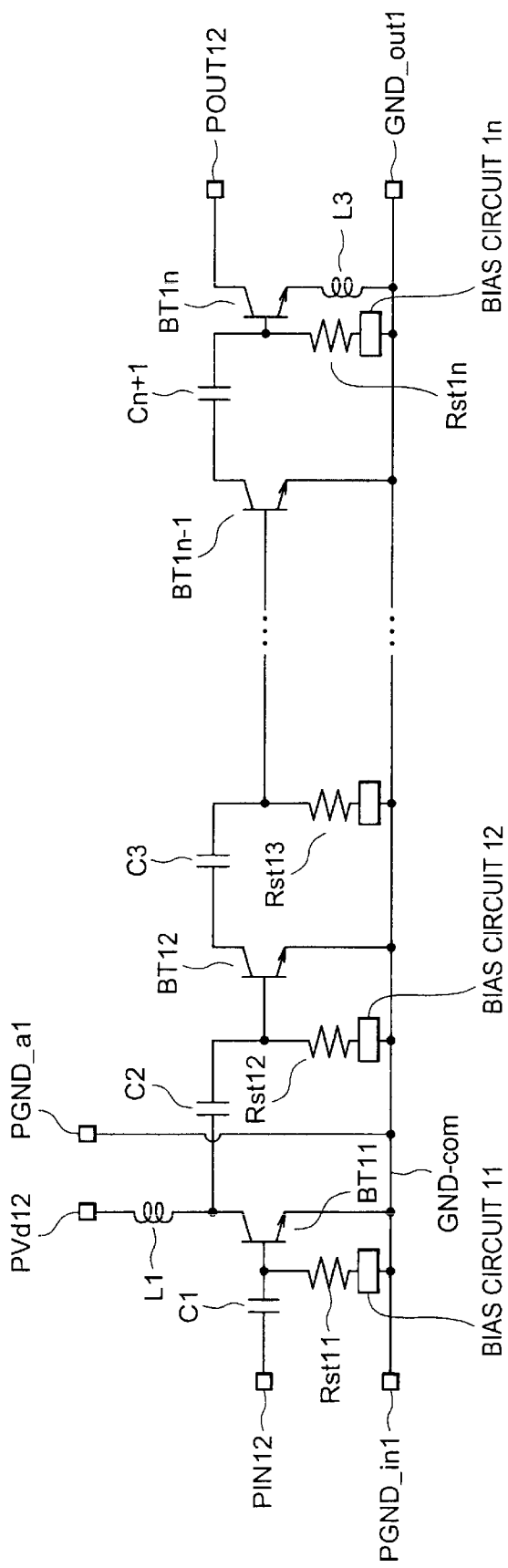
FIG. 15 is a circuit diagram showing a configuration obtained when the MESFETs in FIG. 11 are replaced with bipolar transistors.

The n stages of MESFETs Q1 to Qn shown in FIG. 10 may be replaced with n stages of bipolar transistors BT1 to BTn, as shown in FIG. 14. The n stages of MESFETs Q11 to Q1n shown in FIG. 11 may be replaced with n stages of bipolar transistors BT11 to BT1n, as shown in FIG. 15.

Figure 16:
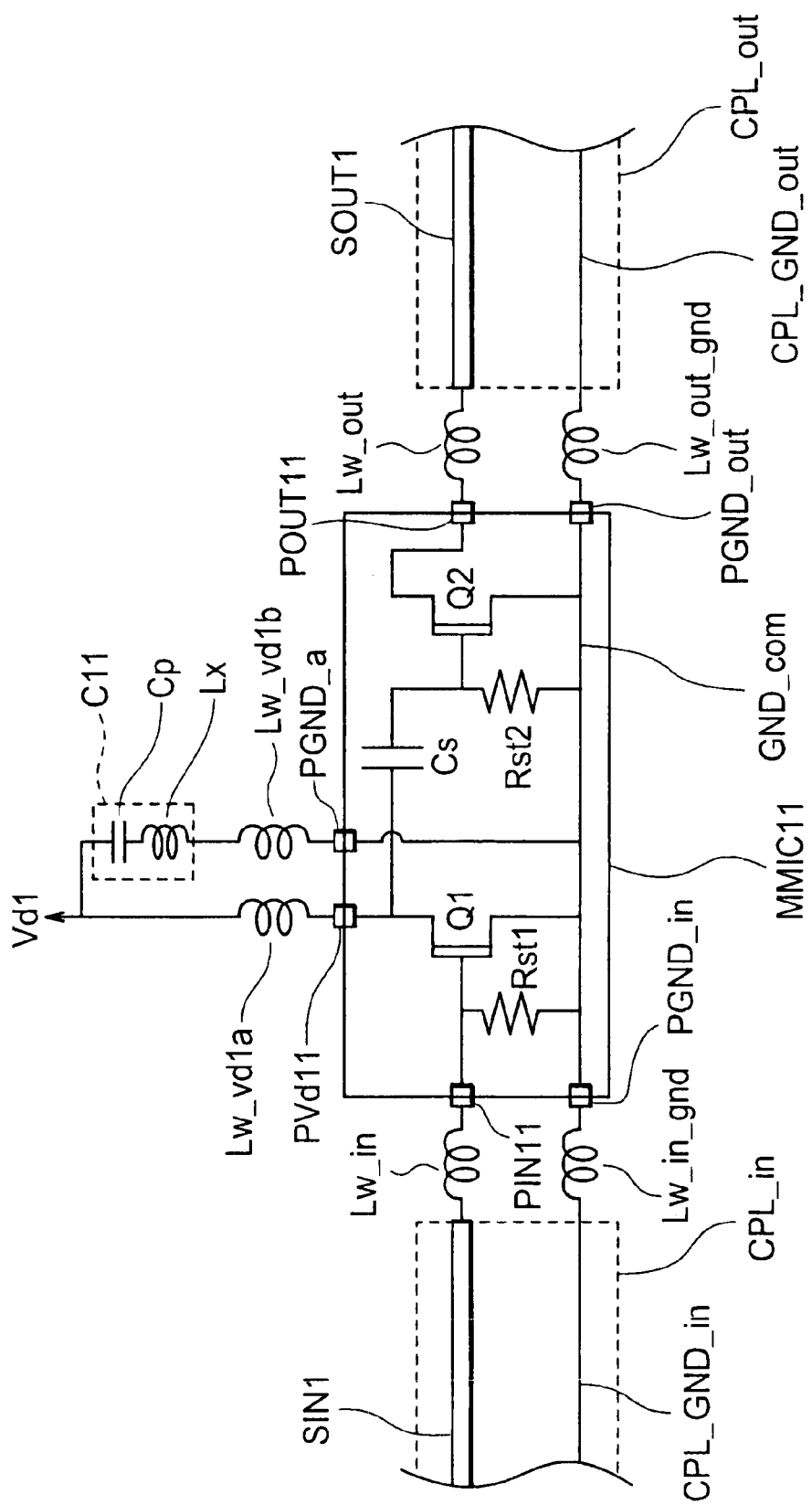
FIG. 16 is a circuit diagram showing a configuration obtained when the microstrip line shown in FIG. 6 is replaced with a coplanar line.

In the above embodiments, microstrip lines are used as the input and output system transmission lines formed on the printed wiring board. Alternatively, a transmission line according to another scheme may be employed, like coplanar lines CPL_in and CPL_out shown in FIG. 16.

As has been described above, the RF amplifier according to each of the above embodiments has a ground node for commonly supplying a ground potential in an amplification circuit, and input and output system ground surfaces electrically separated from each other on a printed wiring board on which the amplification circuit is to be mounted. Thus, oscillation caused by a pseudo-ground potential supply means floating in the amplification circuit can be prevented without increasing the number of terminals. The gain can accordingly be improved while maintaining the stability.

What is claimed is:

1. An RF amplifier in which an amplification circuit with at least two amplification stages is mounted on a printed wiring board, comprising:

a ground node formed in the amplification circuit to commonly supply a ground potential to all the amplification stages;

a first ground surface formed on the printed wiring board to supply a ground potential on an input system transmission line that transmits an input signal to be supplied to the amplification circuit;

a second ground surface, which is formed on the printed wiring board to supply a ground potential on an output system transmission line that transmits an output signal output from the amplification circuit, is electrically separated from said first ground surface on the printed wiring board, and is connected to said first ground surface through said ground node in the amplification circuit; and a capacitor element electrically connected between those ones of power supply terminals of the amplification stages, excluding one on a final stage, included in the amplification circuit, and a third ground terminal electrically connected to said ground node, and mounted on the printed wiring board, wherein
the amplification circuit comprises,
an input terminal for receiving the input signal,
an output terminal for outputting the output signal,
a first ground terminal electrically connected to said first ground surface, and
a second ground terminal electrically connected to said second ground surface, wherein
said first ground terminal is adjacent to said input terminal, and/or said second ground terminal is adjacent to said output terminal.

2. An amplifier according to claim 1, wherein said capacitor element, and a pattern for connecting said capacitor element and the RF amplification circuit are arranged on that region on the printed wiring board where a ground surface with a ground potential is not present.

3. An RF amplifier in which an amplification circuit with at least two amplification stages is mounted on a printed wiring board, comprising:

a ground node formed in the amplification circuit to commonly supply a ground potential to all the amplification stages;

a first ground surface formed on the printed wiring board to supply a ground potential on an input system transmission line that transmits an input signal to be supplied to the amplification circuit;

a second ground surface, which is formed on the printed wiring board to supply a ground potential on an output system transmission line that transmits an output signal output from the amplification circuit, is electrically separated from said first ground surface on the printed wiring board, and is connected to said first ground surface through said ground node in the amplification circuit; and a capacitor element electrically connected between those ones of power supply terminals of the amplification stages, excluding one on a final stage, included in the amplification circuit, and a third ground terminal electrically connected to said ground node, and mounted on the printed wiring board.

4. An amplifier according to claim 3, wherein said capacitor element, and a pattern for connecting said capacitor element and the RF amplification circuit are arranged on that region on the printed wiring board where a ground surface with a ground potential is not present.

5. An amplifier according to claim 3, wherein the input and output system transmission lines are microstrip lines or coplanar lines.

* * * * *